United States Patent
Chang et al.

(10) Patent No.: US 10,408,875 B2
(45) Date of Patent: Sep. 10, 2019

(54) TESTING SYSTEM, METHOD FOR TESTING AN INTEGRATED CIRCUIT AND A CIRCUIT BOARD INCLUDING THE SAME

(71) Applicant: Advanced Semiconductor Engineering, Inc., Kaohsiung (TW)

(72) Inventors: Yu-Jung Chang, Kaohsiung (TW); Wei-Kai Liao, Kaohsiung (TW); Ming-Ching Lin, Kaohsiung (TW); Kuei-Hao Tseng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 333 days.

(21) Appl. No.: 15/183,253

(22) Filed: Jun. 15, 2016

(65) Prior Publication Data
US 2017/0363682 A1    Dec. 21, 2017

(51) Int. Cl.
*G01R 31/02* (2006.01)
*G01R 31/26* (2014.01)
*G01R 31/28* (2006.01)

(52) U.S. Cl.
CPC ..... *G01R 31/2896* (2013.01); *G01R 31/2853* (2013.01)

(58) Field of Classification Search
CPC ............ G01R 31/2853; G01R 31/2896; G01R 31/2834
See application file for complete search history.

(56) References Cited

U.S. PATENT DOCUMENTS

| | | | |
|---|---|---|---|
| 5,194,709 A | 3/1993 | Ichikawa et al. | |
| 5,786,700 A * | 7/1998 | Jen | G01R 31/2853 324/713 |
| 6,737,875 B2 * | 5/2004 | Davis | G01R 1/06788 324/548 |
| 7,332,914 B2 | 2/2008 | Yamaoka et al. | |
| 7,385,410 B2 * | 6/2008 | Payman | G01R 27/205 324/527 |

(Continued)

FOREIGN PATENT DOCUMENTS

TW    I243521 B    11/2005
TW    I266886 B    11/2006

OTHER PUBLICATIONS

Office Action for corresponding Taiwan Patent Application No. 106138138, dated Sep. 5, 2018, 3 pages.

(Continued)

*Primary Examiner* — Minh N Tang
(74) *Attorney, Agent, or Firm* — Foley & Lardner LLP; Cliff Z. Liu

(57) ABSTRACT

A testing system includes a subtractor and a divider. The subtractor is configured to receive a first voltage of a circuit being tested and a second voltage of the circuit, and to derive a difference between the first voltage and the second voltage. The divider is configured to receive the difference between the first voltage and the second voltage, and to derive a resistance of the circuit by dividing (i) the difference between the first voltage and the second voltage by (ii) a difference between a first current applied to the circuit and a second current applied to the circuit. The first voltage is corresponding to the first current, and the second voltage is corresponding to the second current.

20 Claims, 4 Drawing Sheets

(56) References Cited

U.S. PATENT DOCUMENTS 8,030,944 B2 * 10/2011 Ni .................. G01R 31/2853
324/537
2007/0073512 A1 3/2007 Yamaoka et al.

OTHER PUBLICATIONS

Search Report for corresponding Taiwan Patent Application No. 106138138, dated Sep. 5, 2018, 1 page.

* cited by examiner

TESTING SYSTEM, METHOD FOR TESTING AN INTEGRATED CIRCUIT AND A CIRCUIT BOARD INCLUDING THE SAME

BACKGROUND

1. Technical Field

The present disclosure relates to a testing system and a method for operating the same, and, more particularly, to a testing system for an integrated circuit and a method for operating the same.

2. Description of the Related Art

As the performance and complexity of integrated circuits (ICs) have increased over the years, the number of input/output (I/O) pins, or pin count, has also increased significantly. High density devices with high output pin count may have a large number of output pins that may require output testing. It is desirable to have a testing system to verify functionality of ICs.

SUMMARY

In accordance with some embodiments of the present disclosure, a testing system includes: (a) a subtractor configured to receive a first voltage of a circuit being tested and a second voltage of the circuit, and to derive a difference between the first voltage and the second voltage; and (b) a divider configured to receive the difference between the first voltage and the second voltage, and to derive a resistance of the circuit by dividing (i) the difference between the first voltage and the second voltage by (ii) a difference between a first current applied to the circuit and a second current applied to the circuit, where the first voltage is corresponding to the first current, and the second voltage is corresponding to the second current.

In accordance with some embodiments of the present disclosure, a method of testing an IC includes: (a) applying a first current to a pin of the IC; (b) measuring a first voltage at the pin of the IC; (c) applying a second current to the pin of the IC; (d) measuring a second voltage at the pin of the IC; and (e) dividing (i) a difference between the first voltage and the second voltage by (ii) a difference between the first current and the second current to derive a resistance of the IC, where a ratio of the second voltage to the second current is given as a ratio of the first voltage to the first current multiplied by $\beta$ and $\beta$ is in a range of about 0.98 to about 1.

In accordance with some embodiments of the present disclosure, a method of testing a circuit board includes: (a) applying a first current to a conductive pad of the circuit board, the conductive pad being connected to a pin of an IC; (b) measuring a first voltage at the conductive pad of the circuit board; (c) applying a second current to the conductive pad of the circuit board; (d) measuring a second voltage at the conductive pad of the circuit board; (e) dividing (i) a difference between the first voltage and the second voltage by (ii) a difference between the first current and the second current to derive a first resistance ($R_{esd}+R_{pr}$); and (f) deriving a second resistance ($R_{pr}$) by subtracting a third resistance ($R_{esd}$) from the first resistance ($R_{esd}+R_{pr}$), the third resistance ($R_{esd}$) associated with a circuit electrically connected to the pin of the IC.

Figure 1:
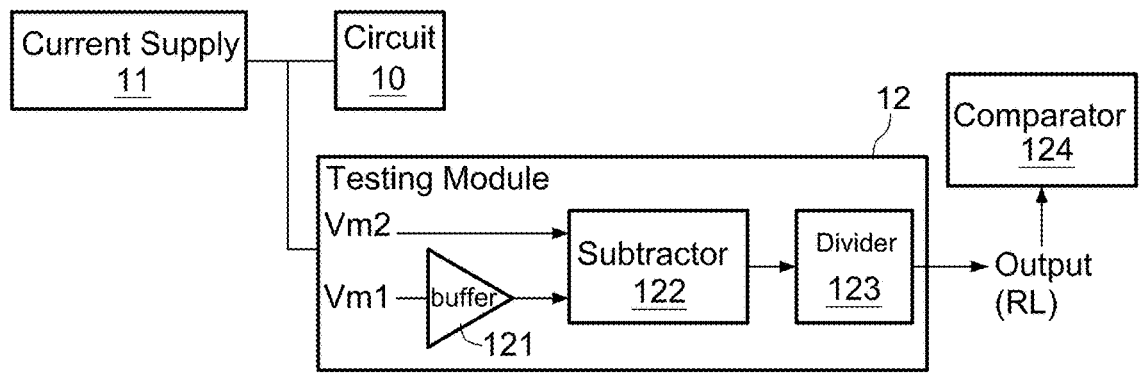
FIG. 1 illustrates a block diagram of a testing system in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

Aspects, features and advantages of example embodiments of the present disclosure will become better understood with regard to the following description in connection with the accompanying drawings. It should be apparent to those skilled in the art that the described embodiments of the present disclosure provided herein are illustrative and not limiting, having been presented by way of example. All features disclosed in this description may be replaced by alternative features serving the same or similar purpose, unless expressly stated otherwise. Therefore, numerous other embodiments of the modifications thereof are contemplated as falling within the scope of the present disclosure as defined herein and equivalents thereto. Further, use of absolute terms with respect to some example embodiments, such as, for example, "must" and "must not," are not meant to limit the scope of the present disclosure as the embodiments disclosed herein are by way of example.

In addition, as used in this specification and the appended claims, the singular article forms "a," "an," and "the" include both singular and plural referents unless the context of their usage clearly dictates otherwise. Thus, for example, reference to "an" input includes multiple inputs as well as a single input, reference to "an output" includes a single output as well as multiple outputs, and the like.

FIG. 1 illustrates a block diagram of a testing system 1 in accordance with some embodiments of the present disclosure. The testing system 1 includes a circuit 10 to be tested, a current supply 11 and a testing module 12.

The current supply 11 is connected to the circuit 10 to be tested for applying a current thereto, and a voltage corresponding to the applied current is obtained accordingly. In one embodiment, the current supply 11 is a constant current source.

The testing module 12 is configured to receive the voltage corresponding to the applied current. The testing module 12 includes a buffer 121, a subtractor 122 and a divider 123. The buffer 121 is configured to delay a signal received from the input of the buffer 121 and to transfer the delayed signal to the subtractor 122. The subtractor 122 has two inputs to receive two signals and to perform subtraction for the signals received from the two inputs. The subtractor 122 is connected to the divider 123 to provide a difference between the two signals to the divider 123. In some embodiments, the buffer 121 can be integrated into the subtractor 122. Other components of the testing module 12 can be combined or integrated together, or can be further sub-divided.

During operation, a first current $I_{m1}$ is applied to the circuit 10 to be tested to obtain a first voltage $V_{m1}$. The first voltage $V_{m1}$ is then sent to the buffer 121 of the testing module 12. A second, different current $I_{m2}$ is applied to the circuit 10 to be tested to obtain a second voltage $V_{m2}$, and the second voltage $V_{m2}$ is sent to the subtractor 122 of the testing module 12. In some embodiments, $I_{m1}$ and $I_{m2}$ are substantially continuous. That is, $I_{m2}=I_{m1}+$delta I when $$\beta \times \left(\frac{V_{m1}}{I_{m1}}\right) = \frac{V_{m2}}{I_{m2}}$$

is met, wherein β is in the range between about 0.98 and about 1 and delta I is in the range between about 50 μA and about 500 μA (e.g., a difference between the currents expressed as an absolute value). The subtractor 122 is configured to subtract the second voltage $V_{m2}$ from the first voltage $V_{m1}$ to derive a difference between the first voltage $V_{m1}$ and the second voltage $V_{m2}$. The difference between the first voltage $V_{m1}$ and the second voltage $V_{m2}$ is then divided by a difference between the first current $I_{m1}$ and the second current $I_{m2}$ by the divider 123 to derive a total resistance RL of the circuit 10 to be tested.

Whether the circuit 10 to be tested functions normally can be checked by comparing the total resistance RL of the circuit 10 to be tested with a predetermined reference resistance value. If the total resistance RL of the circuit 10 to be tested is substantially equal to the reference resistance value, the circuit 10 is determined as normal; otherwise, a further check or inspection can be made on the circuit 10. Alternatively, or in combination, the total resistance RL of the circuit 10 can be compared with a threshold reference resistance value, and, if the resistance RL is between 0 and the threshold value, this may indicate that the circuit 10 is normal. As shown in FIG. 1, a comparator 124 is included to perform a comparison of the total resistance RL of the circuit 10 with a reference value, and may include a display unit to provide a visual indication of a result of the comparison and whether the circuit 10 is (or is not) normal. Although shown separately from the testing module 12, the comparator 124 can be integrated into the testing module 12. In some embodiments, components of the testing module 12 can be implemented in hardware using suitable circuits.

Figure 2:
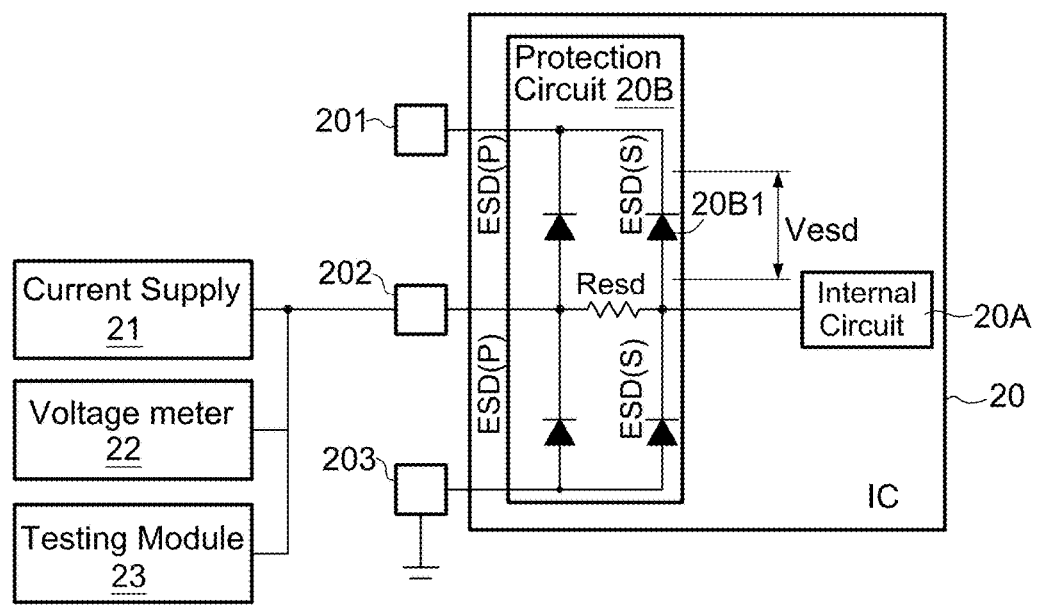
FIG. 2 illustrates a testing system in accordance with some embodiments of the present disclosure.

FIG. 2 illustrates a block diagram of a testing system 2 in accordance with some embodiments of the present disclosure. The testing system 2 includes an IC 20 to be tested, a current supply 21, a voltage meter (or voltmeter) 22 and a testing module 23.

The IC 20 includes an internal circuit 20A and a protection circuit 20B. In some embodiments, the internal circuit 20A can be a digital circuit, an analog circuit, a radio frequency (RF) circuit, a microelectromechanical system (MEMS), a mixed signal circuit or a combination thereof. The protection circuit 20B includes multiple diodes. In some embodiments, the protection circuit 20B may further include passive components (such as current limiting resistors), active components (such as metal-oxide-semiconductor field-effect transistors (MOSFETs) or bipolar junction transistors (BJTs)) or a combination thereof. The IC 20 further includes multiple pins 201, 202, and 203. In some embodiments, the pin 201 is electrically connected to an external electrical source and the pin 203 is electrically connected an external grounding source.

The current supply 21 is connected to the pin 202 of the IC 20 for applying a current thereto, and a voltage corresponding to the applied current is measured by the voltage meter 22.

During operation, a first current $I_{m1}$ is applied to the pin 202 of the IC 20, and a first voltage $V_{m1}$ is measured by the voltage meter 22. The relationship between the first voltage $V_{m1}$ and the first current $I_{m1}$ is shown as the following equation, where $V_{esd1}$ is the voltage of a diode 20B1 measured when the first current $I_{m1}$ is applied to the pin 202 of the IC 20 and $R_{esd}$ is the total resistance of the protection circuit 20B:

$$V_{m1}=V_{esd1}+I_{m1} \times R_{esd} \qquad (1)$$

If the first voltage $V_{m1}$ is 0, the protection circuit 20B, which is electrically connected to the pin 202 of the IC 20, is determined as shorted. If the first voltage $V_{m1}$ is substantially equal to a (non-zero) protection voltage of the current supply 21, the protection circuit 20B, which is electrically connected to the pin 202 of the IC 20, is determined as opened. If the first voltage $V_{m1}$ is not equal to 0 or the protection voltage of the current supply 21, a second current $I_{m2}$ is then applied to the pin 202 of the IC 20 and a second voltage $V_{m2}$ is measured by the voltage meter 22. The relationship between the second voltage $V_{m2}$ and the second current $I_{m2}$ is shown as the following equation, where $V_{esd2}$ is the voltage of the diode 20B1 measured when the second current $I_{m2}$ is applied to the pin 202 of the IC 20:

$$V_{m2}=V_{esd2}+I_{m2} \times R_{esd} \qquad (2)$$

The following equation can be derived by subtracting equation (2) from equation (1):

$$R_{esd}=((V_{m1}-V_{m2})-(V_{esd1}-V_{esd2}))\div(I_{m1}-I_{m2}) \qquad (3)$$

The relationship of the voltage $V_{esd}$ of the diode 20B1 and the current $I_m$ applied to the diode 20B1 is shown as the following equation, where $I_s$ is the reverse bias saturation current, $V_T$ is the thermal voltage and n is the ideality factor:

$$I_m=I_s(e^{(V_{esd}/nV_T)}-1) \qquad (4)$$

In some embodiments, the voltage $V_{esd}$ of the diode 20B1 is about 0.53 V (for silicon diodes) or about 0.18 V (for germanium diodes) when the current $I_m$ of about 1 mA is applied. Alternatively, the voltage $V_{esd}$ of the diode 20B1 is about 0.65 V (for silicon diodes) or about 0.30 V (for germanium diodes) when the current $I_m$ of about 100 mA is applied. Based on the above, due to the nature of the diode 20B1, the voltage $V_{esd}$ of the diode 20B1 does not change significantly even if the current $I_m$ changes by a relatively large degree. By choosing the second current $I_{m2}$ close to the first current $I_{m1}$, the second voltage $V_{esd2}$ would be substantially equal to the first voltage $V_{esd1}$. In some embodiments, a difference between the first current $I_{m1}$ and the second current $I_{m2}$ is greater than about 300 μA. In other embodiments, a ratio of the first current $I_{m1}$ to the first voltage $V_{m1}$ is greater than about 1. In other embodiments, a ratio of the second current $I_{m2}$ to the second voltage $V_{m2}$ is greater than about 1. Therefore, equation (3) can be simplified as follows:

$$R_{esd}\approx(V_{m1}-V_{m2})\div(I_{m1}-I_{m2}) \qquad (5)$$

The testing module 23 is connected to the current supply 21 and the voltage meter 22 to receive the applied current and the measured voltage. The total resistance $R_{esd}$ of the protection circuit 20B can be determined by the testing module 23 based on the applied first and second currents $I_{m1}$ and $I_{m2}$ and the measured first and second voltages $V_{m1}$ and $V_{m2}$. For example, if the resistance $R_{esd}$ is determined as 0 by the testing module 23, this may indicate that the protection circuit 20B, which is electrically connected to the pin 202 of the IC 20, is shorted. In other embodiments, if the first voltage $V_{m1}$ is 0, this may also indicate that the protection circuit 20B is shorted. For another example, if the resistance $R_{esd}$ is over a threshold reference value, this may indicate that the protection circuit 20B, which is electrically connected to the pin 202 of the IC 20, is opened. In other embodiments, if the first voltage $V_{m1}$ is over a threshold value, this may indicate that the protection circuit 20B is opened. As another example, if the resistance $R_{esd}$ is between 0 and the threshold value, this may indicate that the protection circuit 20B, which is electrically connected to the pin 202 of the IC, is good or normal. In some embodiments, the testing module 23 can be implemented similarly as the testing module 12 shown in FIG. 1. In some embodiments, the voltage meter 22 can be integrated into the testing module 23. Other components of the testing system 2 can be combined or integrated together, or can be further subdivided.

In some embodiments, an IC can be tested by measuring a voltage at a pin of the IC without powering the IC, where, once the measured voltage is between 0 and a threshold, the IC is regarded as good or normal. However, such testing method may have a relatively large tolerance. The testing system 2 shown in FIG. 2, which determines the functionality of the pin 202 of the IC 20 by both of the measured voltage and the total resistance $R_{esd}$ of the protection circuit 20B, affords higher accuracy and reliability.

In some embodiments, an IC is powered and tested by an in-circuit-test (ICT) equipment, and at least two test terminals or pads are specified on the ICT equipment for the test. The testing system 2 shown in FIG. 2, which can specify just one pin, one terminal or one pad for testing, may save cost and time. In addition, in comparison with the ICT equipment, which cannot measure the value of $R_{esd}$, the testing system 2 shown in FIG. 2 affords higher accuracy and precision.

Figure 3:
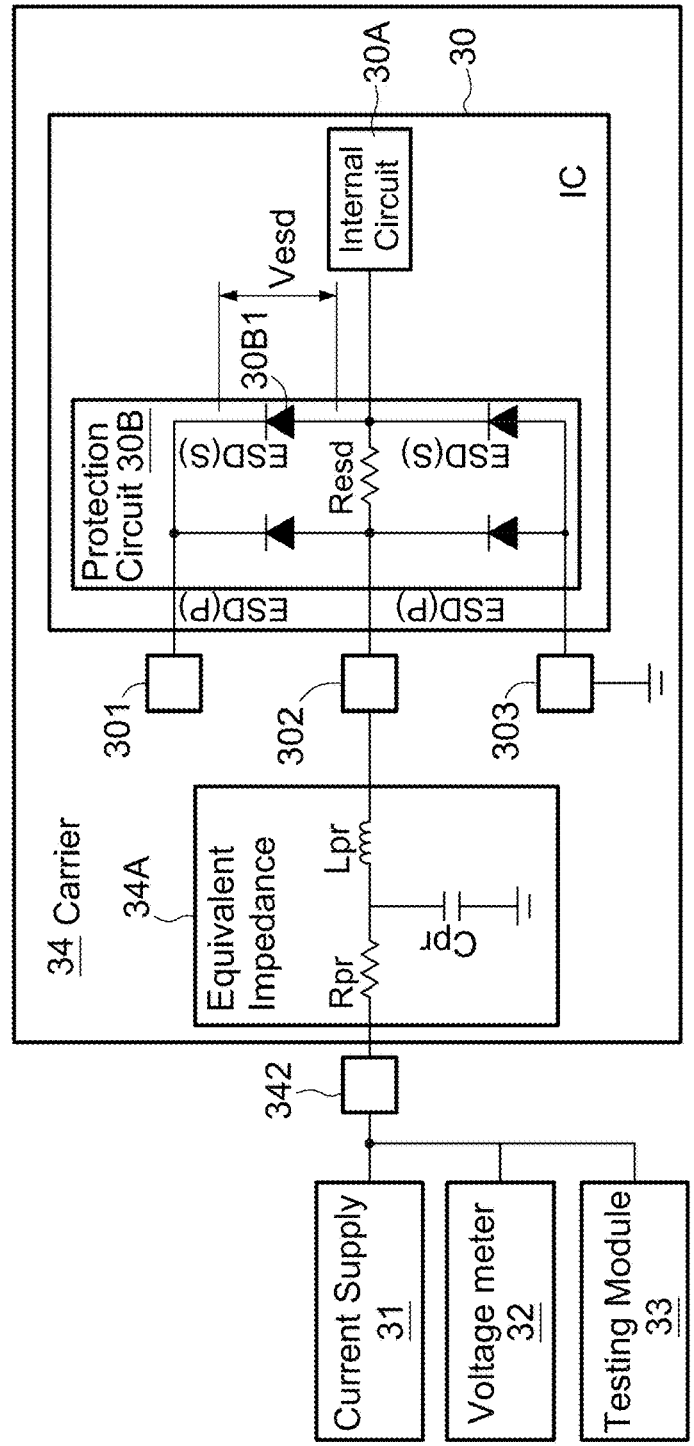
FIG. 3 illustrates a testing system in accordance with some embodiments of the present disclosure.

FIG. 3 illustrates a block diagram of a testing system 3 in accordance with some embodiments of the present disclosure. The testing system 3 includes an IC 30 to be tested, a current supply 31, a voltage meter 32, a testing module 33 and a carrier 34.

The carrier 34 is formed of, for example, a printed circuit board (PCB), such as a paper-based copper foil laminate, a composite copper foil laminate, or a polymer-impregnated glass fiber-based copper foil laminate. The carrier 34 may have electrical interconnects (not shown), such as a redistribution layer (RDL).

The IC 30 is located on the carrier 34. The IC 30 includes an internal circuit 30A and a protection circuit 30B. In some embodiments, the internal circuit 30A can be a digital circuit, an analog circuit, a RF circuit, a MEMS, a mixed signal circuit or a combination thereof. The protection circuit 30B includes multiple diodes. In some embodiments, the protection circuit 30B may further include passive components (such as resistors), active components (such as MOSFETs or BJTs) or a combination thereof. The IC 30 further includes multiple pins 301, 302, and 303 electrically connected to conductive pads on the carrier 34. In some embodiments, an equivalent impedance 34A (including components bonded on the carrier) between the pin 302 of the IC 30 and a conductive pad 342 of the carrier 34 can be represented as a circuit formed by a resistor $R_{pr}$, a capacitor $C_{pr}$ and an inductor $L_{pr}$ as shown in FIG. 3.

The current supply 31 is connected to the conductive pad 342 of the carrier 34 for applying a current thereto, and a voltage corresponding to the applied current is measured by the voltage meter 32.

During operation, a first current $I_{m1}$ is applied to the pin 302 of the IC 30 through the conductive pad 342, and a first voltage $V_{m1}$ is measured by the voltage meter 32. The current supply 31 may apply a direct current (DC) such that the effect of the capacitor $C_{pr}$ and the inductor $L_{pr}$ can be neglected. Therefore, the relationship between the first voltage $V_{m1}$ and the first current $I_{m1}$ is shown as the following equation, where $V_{esd1}$ is the voltage of a diode 30B1 measured when the first current $I_{m1}$ is applied to the conductive pad 342 of the carrier 34 and $R_{esd}$ is the total resistance of the protection circuit 30B:

$$V_{m1}=V_{esd1}+I_{m1}\times(R_{esd}+R_{pr}) \tag{6}$$

If the measured first voltage $V_{m1}$ is 0, the equivalent impedance 34A or the protection circuit 30B, or both, may be determined as shorted. If the measured first voltage $V_{m1}$ is substantially equal to a protection voltage of the current supply 31, the equivalent impedance 34A or the protection circuit 30B, or both, may be determined as opened. If the measured first voltage $V_{m1}$ is not equal to 0 or the protection voltage of the current supply 31, a second current $I_{m2}$ is then applied to the conductive pad 342 of the carrier 34 and a second voltage $V_{m2}$ is measured by the voltage meter 32. The relationship between the second voltage $V_{m2}$ and the second current $I_{m2}$ is shown as the following equation, where $V_{esd2}$ is the voltage of the diode 30B1 under the second current $I_{m2}$:

$$V_{m1}=V_{esd2}+I_{m2}\times(R_{esd}+R_{pr}) \tag{7}$$

The following equation can be derived by subtracting equation (6) from equation (7):

$$R_{esd}+R_{pr}=((V_{m1}-V_{m2})-(V_{esd1}-V_{esd2}))\div(I_{m1}-I_{m2}) \tag{8}$$

The relationship of the voltage $V_{esd}$ of the diode 30B 1 and the current $I_m$ applied to the diode 30B1 is represented by equation (4) shown above. In some embodiments, the voltage $V_{esd}$ of the diode 30B1 is about 0.53 V (for silicon diodes) or about 0.18 V (for germanium diodes) when the current $I_m$ of about 1 mA is applied. Alternatively, the voltage $V_{esd}$ of the diode 30B1 is about 0.65 V (for silicon diodes) or about 0.30 V (for germanium diodes) when the current $I_m$ of about 100 mA is applied. Based on the above, due to the nature of the diode 30B1, the voltage $V_{esd}$ of the diode 30B1 does not change significantly even if the current $I_m$ changes by a relatively large degree. By choosing the second current $I_{m2}$ close to the first current $I_{m1}$, the second voltage $V_{esd2}$ would be substantially equal to the first voltage $V_{esd1}$. In some embodiments, a difference between the first current $I_{m1}$ and the second current $I_{m2}$ is greater than about 300 μA. In other embodiments, a ratio of the first current $I_{m1}$ to the first voltage $V_{m1}$ is greater than about 1. In other embodiments, a ratio of the second current $I_{m2}$ to the second voltage $V_{m2}$ is greater than about 1. Therefore, equation (8) can be simplified as follows:

$$R_{esd}+R_{pr}\approx(V_{m1}-V_{m2})\div(I_{m1}-I_{m2}) \tag{9}$$

The testing module 33 is connected to the current supply 31 and the voltage meter 32 to receive the applied current and the measured voltage. The sum of the resistance $R_{esd}$ of the protection circuit 30B and the resistance $R_{pr}$ of the carrier 34 between the conductive pad 342 and the pin 302 can be calculated by the testing module 23 based on the applied first and second currents $I_{m1}$ and $I_{m2}$ and the measured first and second voltages $V_{m1}$ and $V_{m2}$. Since the resistance $R_{esd}$ of the protection circuit 30B can be calculated through the testing system 2 shown in FIG. 2, the resistance $R_{pr}$ can be obtained by subtracting the resistance $R_{esd}$ from the sum of the resistance $R_{esd}$ and the resistance $R_{pr}$. If the resistance $R_{pr}$ is substantially equal to a predetermined reference value of the resistance of the carrier 34, the components on the carrier 34 (between the conductive pad 342 and the pin 302) may be determined as good or normal; otherwise, the components on the carrier 34 may be determined as failed or to be further tested or replaced. In some embodiments, the testing module 33 can be implemented similarly as the testing module 12 shown in FIG. 1. In some embodiments, the voltage meter 32 can be integrated into the testing module 33. Other components of the testing system 3 can be combined or integrated together, or can be further sub-divided.

In some embodiments, whether the components on the carrier 34 function normally is determined by inspecting a measured voltage without calculating the resistance $R_{pr}$ of the carrier 34. In comparison with such embodiments, the testing system 3 shown in FIG. 3, which compares the resistance $R_{pr}$ of the carrier 34 with the reference resistance, affords higher accuracy and reliability. In addition, it may be unnecessary to turn on or power the IC 30 for functionality checking by using the testing system 3 shown in FIG. 3, which can reduce the time and cost for testing the carrier 34.

In some embodiments, the resistance $R_{pr}$ of the carrier 34 can be measured by using an ICT equipment, which specify connection to two nodes of the carrier 34 to conduct a measurement. In comparison to the use of ICT, the testing system 3 in FIG. 3 can obtain the resistance $R_{pr}$ of the carrier 34 by connecting to just one node, which can reduce the time and cost for testing the carrier 34.

Figure 4:
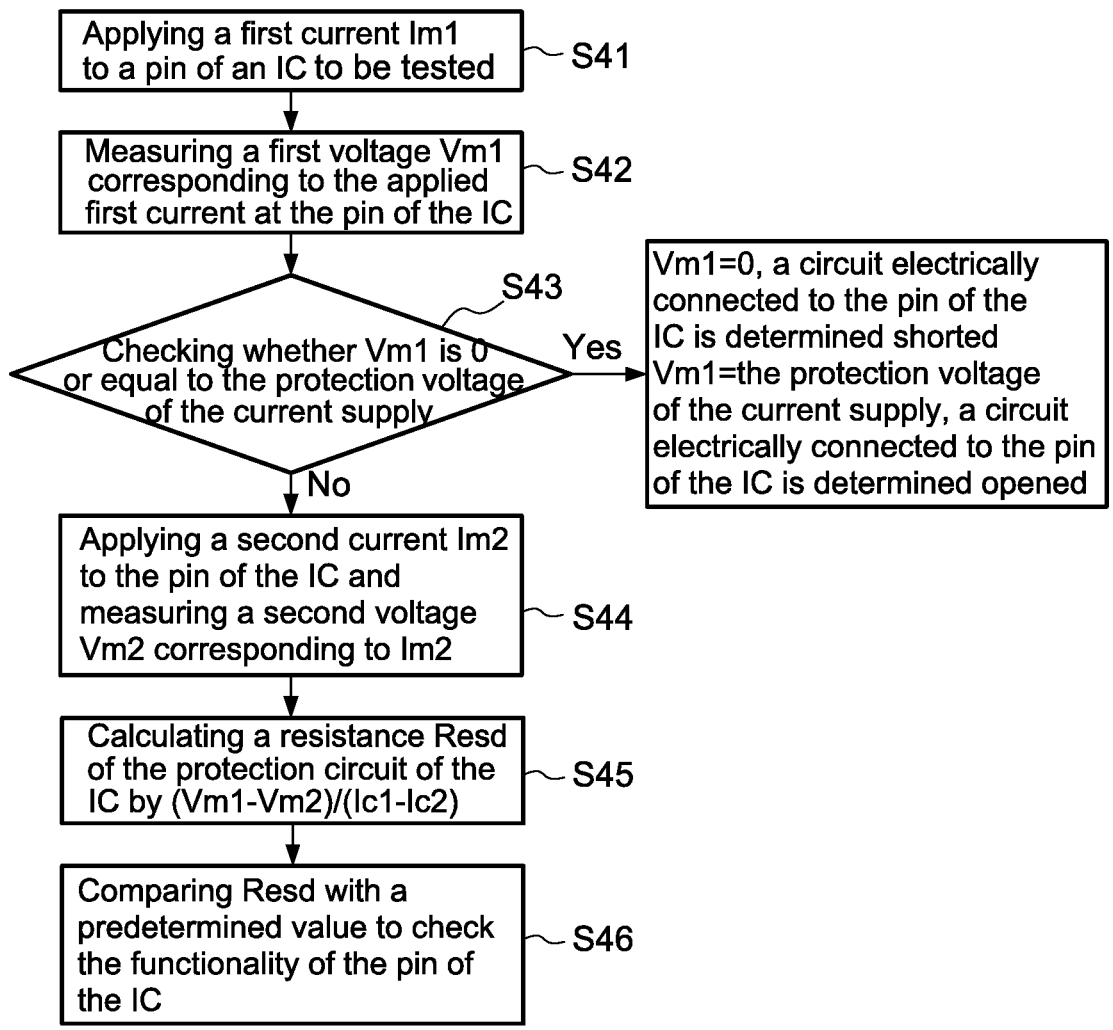
FIG. 4 illustrates a flow chart of the operations for testing an IC in accordance with some embodiments of the present disclosure.

FIG. 4 illustrates a flow chart of the operations for testing an IC in accordance with some embodiments of the present disclosure.

Referring to the operation S41, a first current $I_{m1}$ is applied to a pin of the IC to be tested. In some embodiments, the first current $I_{m1}$ can be applied by a current supply.

Referring to the operation S42, a first voltage $V_{m1}$ corresponding to the applied first current $I_{m1}$ is measured at the pin of the IC. In some embodiments, the first voltage $V_{m1}$ can be measured by a voltage meter.

Referring to the operation S43, the first voltage $V_{m1}$ is checked to determine whether the first voltage $V_{m1}$ is equal to 0 or a protection voltage of the current supply. If the first voltage $V_{m1}$ is equal to 0, a circuit electrically connected to the pin of the IC is determined as shorted. If the first voltage $V_{m1}$ is substantially equal to the protection voltage of the current supply, a circuit electrically connected to the pin of the IC is determined as opened.

Referring to the operation S44, a second current $I_{m2}$ is applied to the pin of the IC to obtain a second voltage $V_{m2}$ corresponding to the applied second current $I_{m2}$, if the first voltage $V_{m1}$ is not equal to 0 or the protection voltage of the current supply. In some embodiments, a difference between the first current $I_{m1}$ and the second current $I_{m2}$ is greater than about 300 μA. In other embodiments, a ratio of the first current $I_{m1}$ to the first voltage $V_{m1}$ is greater than about 1. In other embodiments, a ratio of the second current $I_{m2}$ to the second voltage $V_{m2}$ is greater than about 1.

Referring to the operation S45, a resistance $R_{esd}$ of a protection circuit of the IC is calculated by equation (5) shown above.

Referring to the operation S46, the resistance $R_{esd}$ is compared with a predetermined threshold value to check the functionality of the pin of the IC. If the resistance $R_{esd}$ is determined as 0, a circuit electrically connected to the pin of the IC is determined as shorted, and, if the resistance $R_{esd}$ is over the threshold value, a circuit electrically connected to the pin of the IC is determined as opened; otherwise a circuit electrically connected to the pin of the IC is determined as normal. In other embodiments, if the first voltage $V_{m1}$ is 0, this may also indicate that the circuit electrically connected to the pin of the IC is shorted, and, if the first voltage $V_{m1}$ is above a threshold value, this may indicate that the circuit is opened.

In some embodiments, whether a pin of an IC functions normally is determined by inspecting the measured voltage without calculating the total resistance of a protection circuit. In comparison with such embodiments, the testing operations shown in FIG. 4, which determine the functionality of the pin of the IC by both of the measured voltage and the resistance $R_{esd}$ of the protection circuit, afford higher accuracy and reliability. In addition, it may be unnecessary to turn on or power the IC for functionality checking, which can reduce the time and cost for testing the IC.

Figure 5:
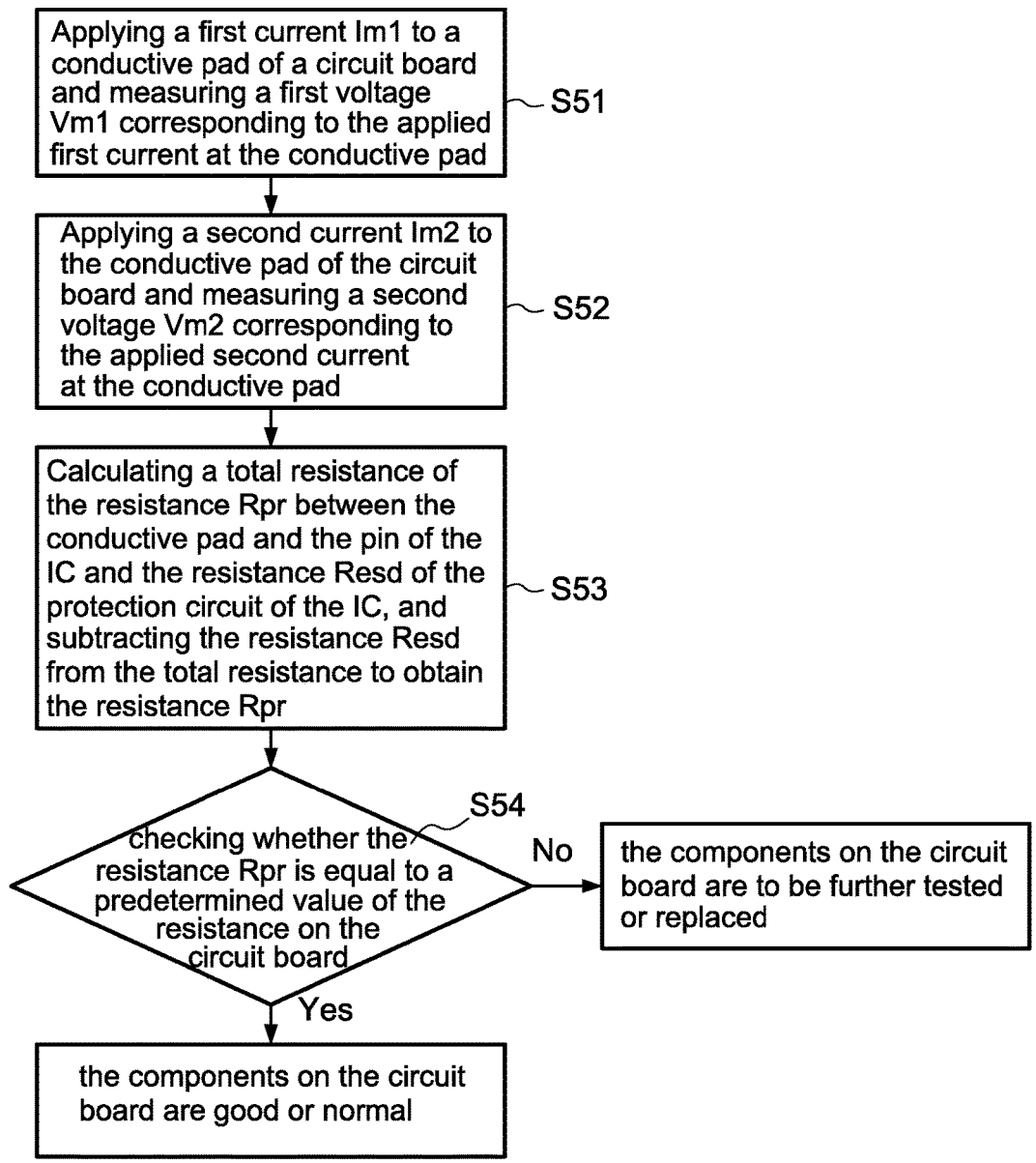
FIG. 5 illustrates a flow chart of the operations for testing a circuit board in accordance with some embodiments of the present disclosure.

FIG. 5 illustrates a flow chart of the operations for testing a circuit board (or other carrier) on which an IC is located, in accordance with some embodiments of the present disclosure.

Referring to the operation S51, a first current $I_{m1}$ is applied to a conductive pad of the circuit board that is connected to a pin of the IC. In some embodiments, the first current $I_{m1}$ can be applied by a current supply. A first voltage $V_{m1}$ corresponding to the applied first current $I_{m1}$ is measured at the conductive pad of the circuit board. In some embodiments, the first voltage $V_{m1}$ can be measured by a voltage meter.

Referring to the operation S52, a second current $I_{m2}$ is applied to the conductive pad of the circuit board. A second voltage $V_{m2}$ corresponding to the applied second current $I_{m2}$ is measured at the conductive pad of the circuit board.

Referring to the operation S53, a total resistance $R_{pr}$ of the circuit board between the conductive pad and the pin of the IC and a resistance $R_{esd}$ of a protection circuit of the IC is calculated by equation (9) shown above. Since the resistance $R_{esd}$ of the protection circuit of the IC can be calculated by the operations shown in FIG. 4, the resistance $R_{pr}$ can be obtained by subtracting the resistance $R_{esd}$ from the sum of the resistance $R_{esd}$ and the resistance $R_{pr}$.

Referring to the operation S54, the resistance $R_{pr}$ is compared with a predetermined reference value of the resistance of the circuit board. If the resistance $R_{pr}$ is substantially equal to the reference value of the resistance of the circuit board, components on the circuit board are determined as good or normal; otherwise, the components on the circuit board are determined as failed or to be further tested or replaced.

In some embodiments, whether the conductive pad of the circuit board functions normally is determined by inspecting the measured voltage without calculating the total resistance of the circuit board. In comparison with such embodiments, the testing operations shown in FIG. 5, which compares the calculated resistance of the circuit board with the reference resistance, afford higher accuracy and reliability. In addition, it may be unnecessary to turn on or power the IC for functionality checking by using the testing operations shown in FIG. 5, which can reduce the time and cost for testing the circuit board.

In some embodiments, the resistance $R_{pr}$ of the circuit board can be measured by using an ICT equipment, which specify connection to two nodes of the circuit board to conduct a measurement. In comparison to the use of ICT, the testing operations in FIG. 5 can obtain the resistance $R_{pr}$ of the circuit board by connecting to just one node, which can reduce the time and cost for testing the circuit board.

As used herein, the terms "substantially," "substantial," "approximately," and "about" are used to describe and account for small variations. When used in conjunction with an event or circumstance, the terms "substantially," "substantial," "approximately," and "about" can refer to instances in which the event or circumstance occurs precisely, as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, when comparing a first numerical value with a second, reference numerical value, the first numerical value can be deemed to be "substantially" equal or the same as the second numerical value if the first numerical value lies in a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A testing system, comprising:
   a subtractor configured to receive a first voltage of an integrated circuit (IC) being tested and a second voltage of the IC being tested, and to derive a difference between the first voltage and the second voltage; and
   a divider configured to receive the difference between the first voltage and the second voltage, and to derive a resistance of the IC being tested by dividing (i) the difference between the first voltage and the second voltage by (ii) a difference between a first current applied to the IC being tested and a second current applied to the IC being tested,
   wherein the first voltage corresponds to the first current, and the second voltage corresponds to the second current.

2. The testing system of claim 1, further comprising a current source configured to apply the first current and the second current, and wherein a difference between the first current and the second current is in a range of about 50 microamperes (μA) to about 500 μA.

3. The testing system of claim 1, further comprising a current source configured to apply the first current and the second current, and wherein a ratio of the second voltage to the second current is given as a ratio of the first voltage to the first current multiplied by $\beta$ and $\beta$ is in a range of about 0.98 to about 1.

4. The testing system of claim 1, further comprising a current source configured to apply the first current and the second current to a pin of the IC being tested, and wherein the first voltage is obtained at the pin of the IC being tested corresponding to the first current, and the second voltage is obtained at the pin of the IC being tested corresponding to the second current.

5. The testing system of claim 1, further comprising a comparator configured to determine that a protection circuit of the IC being tested is shorted if the resistance is 0.

6. The testing system of claim 1, further comprising a comparator configured to determine that a protection circuit of the IC being tested is opened if the resistance is over a threshold value.

7. The testing system of claim 1, further comprising a comparator configured to determine that a protection circuit of the IC being tested is normal if the resistance is substantially equal to a reference value.

8. The testing system of claim 1, further comprising a current source configured to apply the first current and the second current to a conductive pad of a circuit board being tested, and wherein the first voltage is obtained at the conductive pad of the circuit board and corresponds to the first current, and the second voltage is obtained at the conductive pad of the circuit board and corresponds to the second current.

9. The testing system of claim 8, wherein:
   an equivalent impedance is between a pin of the IC (IC) being tested and the conductive pad of the circuit board, wherein the IC being tested is located on the circuit board and the IC being tested comprises a pin, the first current being applied to the pin of the IC being tested.

10. The testing system of claim 9, wherein the equivalent impedance is represented as a combination of a resistor having a resistance $R_{pr}$, a capacitor and an inductor.

11. The testing system of claim 10, further comprising:
    a protection circuit including the resistance, the resistance being a total resistance of the protection circuit.

12. The testing system of claim 11, wherein:
    a sum of the resistance+$R_{pr}$ is about $(V_{m1}-V_{m2})\div(I_{m1}-I_{m2})$.

13. The testing system of claim 11, wherein the current source is configured to apply a direct current.

14. The testing system of claim 9, further comprising:
    a voltage meter configured to measure the first voltage and the second voltage respectively corresponding to the first current and the second current.

15. A method of testing an integrated circuit (IC), comprising:
    (a) applying, by a current supply, a first current to a pin of the IC;

(b) measuring, by a voltage meter, a first voltage at the pin of the IC;
(c) applying, by the current supply, a second current to the pin of the IC;
(d) measuring, by the voltage meter, a second voltage at the pin of the IC; and
(e) dividing, by a divider, (i) a difference between the first voltage and the second voltage by (ii) a difference between the first current and the second current to derive a resistance of the IC,
wherein a ratio of the second voltage to the second current is given as a ratio of the first voltage to the first current multiplied by β and β is in a range of about 0.98 to about 1.

16. The method of claim 15, wherein a difference between the first current and the second current is in a range of about 50 μA to about 500 μA.

17. The method of claim 15, wherein in operation (b), if the first voltage is 0, a protection circuit of the IC electrically connected to the pin of the IC is determined as shorted.

18. The method of claim 15, wherein in operation (b), if the first voltage is substantially equal to a protection voltage of a current supply applying the first current, a protection circuit of the IC electrically connected to the pin of the IC is determined as opened.

19. The method of claim 15, wherein in operation (e), if the resistance is 0, a protection circuit of the IC electrically connected to the pin of the IC is determined as shorted.

20. The method of claim 15, wherein in operation (e), if the resistance is over a threshold value, a circuit electrically connected to the pin of the IC is determined as opened.

* * * * *